(12) United States Patent
Schulz et al.

(10) Patent No.: US 6,913,528 B2
(45) Date of Patent: *Jul. 5, 2005

(54) LOW AMPLITUDE, HIGH SPEED POLISHER AND METHOD

(75) Inventors: Stephen C. Schulz, Gilbert, AZ (US); John D. Herb, Phoenix, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/812,655

(22) Filed: Mar. 19, 2001

(65) Prior Publication Data

US 2002/0132561 A1 Sep. 19, 2002

(51) Int. Cl.[7] .................................................. B24B 1/00
(52) U.S. Cl. ...................... 451/285; 451/286; 451/287; 451/288; 451/289; 451/165; 451/270
(58) Field of Search ................... 451/165, 285–290, 451/270, 271, 158–160, 41, 115, 5; 438/692–693

(56) References Cited

U.S. PATENT DOCUMENTS

| | | | | |
|---|---|---|---|---|
| 5,187,899 A | * | 2/1993 | Rhoades | 451/165 |
| 5,313,741 A | * | 5/1994 | Toyama | 125/13.02 |
| 5,315,792 A | * | 5/1994 | Schweizer et al. | 451/115 |
| 5,554,064 A | * | 9/1996 | Breivogel et al. | 451/41 |
| 6,135,858 A | * | 10/2000 | Takahashi | 451/41 |
| 6,152,805 A | * | 11/2000 | Takahashi | 451/36 |
| 6,159,080 A | * | 12/2000 | Talieh | 451/41 |
| 6,184,139 B1 | * | 2/2001 | Adams et al. | 438/691 |
| 6,343,978 B1 | * | 2/2002 | Shimizu et al. | 451/287 |
| 6,390,903 B1 | * | 5/2002 | Takahashi et al. | 451/286 |
| 6,413,156 B1 | * | 7/2002 | Shimizu et al. | 451/287 |
| 6,500,055 B1 | * | 12/2002 | Adams et al. | 451/270 |

OTHER PUBLICATIONS

NOTE: Applicant is not aware of any patents, publications, or other information for consideration by the Patent Office.

* cited by examiner

Primary Examiner—George Nguyen
(74) Attorney, Agent, or Firm—Snell & Wilmer L.L.P.

(57) ABSTRACT

A method and apparatus for improving uniformity of the rate of removal of material from the surface of a workpiece, such as semiconductor substrate, by polishing. In accordance with the invention, the workpiece is subjected to a vibratory polishing method, and optionally at least one additional polishing motion selected from rotational, oscillating, sweeping, orbital and linear polishing motions. As a result, polished workpieces, such as semiconductor wafers, have reduced surface defects, improved planarity, and are polished more uniformly over a wider area.

13 Claims, 7 Drawing Sheets

LOW AMPLITUDE, HIGH SPEED POLISHER AND METHOD

BACKGROUND

1. Field of the Invention

The invention relates to integrated circuit manufacturing technology, and more specifically, to processes for planarizing and smoothing surfaces of wafer-type semiconductor substrates, such as semiconductor wafers, through chemical mechanical and other polishing.

2. Description of the Related Art

Photolithographic optics-based processes are used in the manufacture of integrated circuits, and since these processes require accurate focusing to produce a precise image, surface planarity becomes an important issue. This is becoming increasingly critical as line widths are being reduced in size in order to make semiconductor devices even more compact, and to provide higher speeds. More accurate optical focusing for finer line widths results in a loss of "depth of field" (i.e., the focusing is very accurate only in a plane of very limited depth). Accordingly, a planar surface is essential to ensure good focusing to enable the photolithographic process to produce fine line width, compact high speed semiconductor devices.

There are several techniques for planarizing the surface of a semiconductor wafer. One of these is chemical mechanical polishing (CMP). As indicated in an article entitled "Chemical Mechanical Polishing: The Future of Sub Half Micron Devices," Dr. Linton Salmon, Brigham Young University (15 Nov. 1996), CMP is now considered the most effective method yet for planarizing wafers with sub micron lines. In this process, a wafer is mounted on a rotary carrier or chuck with the integrated circuit side facing outward. A polishing pad is then brought into contact with the integrated circuit side. Pressure may be applied by the carrier and/or the platen to effectuate polishing. According to Salmon, in some CMP machines the wafer rotates while the polishing pad is stationary, in others the pad rotates while the wafer carrier is stationary, and in yet another type both the wafer carrier and the pad rotate simultaneously. The polishing pad may be pre-soaked and continually re-wet with a slurry that has a variety of abrasive particles suspended in a solution. Typically, the particles range in size from 30 to 1,100 nanometers. After planarization through polishing, the wafers go through a post-CMP clean up to remove residual slurry, metal particles, and other potential contaminants from its surface.

An important variable in planarization through CMP is "removal rate" which is the rate of removal of material from the surface of the semiconductor wafer being polished. Preferably, the rate of removal should be such that any surface peaks are preferentially flattened and the resultant surface should be as near perfectly planar as possible. There are several factors that may affect the rate of removal. For example, the nature of the slurry can have a dramatic effect. The slurry includes abrasive particles suspended in a solvent which selectively may soften certain features of the pattern on the semiconductor wafer surface, thereby affecting the relative rate of removal of those features vis-à-vis others. As indicated in the above article, "The purpose of the slurry is simple, yet understanding and modeling all the mechanical and chemical reactions involved is nearly impossible." Accordingly, development of the CMP process has proceeded on a "trial and error basis."

U.S. Pat. No. 5,554,064 relates to an apparatus for polishing semiconductor wafers through an orbital polishing motion. Such orbital polishers and others are now in commercial use, but it has been found that orbital polishers generally do not provide completely uniform stock removal across the entire surface of the wafer. An edgeband at the periphery of the disk is subject to a different polishing rate, as explained below.

Referring to FIG. 1A, a wafer 10 is held in a carrier 12 that is surrounded by a wear ring 16. As shown, the face of the wafer to be polished is in contact with a polish pad 18 backed by a platen 20. During orbital polishing, the polish pad 18 is brought into movement, as shown by the arrows in FIG. 1A. Thus, at least a portion of the polish pad near the edge or periphery of the wafer is in contact with the wear ring, which has significantly different properties than the wafer. It is believed by some that this difference in properties results in a different removal rate at the periphery of the wafer that forms an edgeband, illustrated in FIG. 1B. In the illustrated example, a 200 mm diameter wafer 12 is brought into contact with a polish pad 18, that is mounted a wave generator, as described in U.S. Pat. No. 5,554,064. As a consequence, the centerCp of the polish pad orbits about the center of spin Cs of the wave generator. Moreover, the center of the wafer Cw is offset from the center of spin of the wave generator by 0.375 in. (9.5 mm). It has been found that with these particular parameters, a differential removal rate edgeband of about 1.25 in. (31.75 mm) width would develop. Thus, while orbital polishers represent an advance in the art of semiconductor wafer polishing, even these advanced polishers have shortcomings.

Moreover, orbital polishers, in common with most other polishing apparatus, are subject to sensitivity based on the nature of the pad, pad platen, slurry, wafer carrier, pressure control and speed control. Accordingly, there are numerous factors that affect polish aside from the nature of the apparatus being used.

Semiconductor manufacturers consistently require CMP processes to improve over time. As semiconductor devices become ever more complex and device geometry and circuitry becomes finer, there exists a need to make the CMP removal rate more consistent from wafer to wafer, and wafer lot to wafer lot, while also making the polishing results more uniform across the entire surface of the wafer.

SUMMARY OF THE INVENTION

This summary of the invention section is intended to introduce the reader to aspects of the invention and is not a complete description of the invention. Particular aspects of the invention are pointed out in other sections herein below and the invention is set forth in the appended claims, which alone demarcate its scope.

The invention provides a method of improving the uniformity of the rate of removal of material from the surface of a semiconductor substrate, such as a wafer having integrated circuits formed thereon.

The objectives of the invention are achieved through use of "in-plane vibratory polishing," i.e. a small amplitude high frequency polishing, of the surface of a workpiece. This high speed low amplitude motion may be accompanied by other polishing motions such as rotational, orbital, oscillating, sweeping and linear movement, and combinations of these. As explained in more detail elsewhere herein, the small amplitude, high frequency polishing motion provides stock removal more uniformly across the workpiece thereby reducing "within workpiece" nonuniformity and also decreasing the width of the edgeband of disk shaped workpieces that is frequently not polished to the same extent as the other portions of the workpiece.

In accordance with one embodiment of the method of the invention, a semiconductor wafer held in a wafer carrier (which may be in rotational, orbital, oscillatory or linear motion, or which may be stationary) is brought into contact with a polishing pad that is in low amplitude, high frequency motion. Preferably, but not necessarily, a polishing slurry is applied, either through the pad itself or through distribution onto the pad to allow infiltration between the pad and the wafer surface being polished. The vibratory polishing motion is maintained while applying a sufficient pressure to polish the semiconductor wafer surface to a desired degree of planarity. The resultant polished wafer has reduced surface defects, such as dishing, erosion, microscratches, and residual finer scratches. Moreover, polish times are reduced, i.e. stock removal rate is increased.

In accordance with another embodiment of the method of the invention, the polishing motions are inverted in the sense that the wafer held in the carrier is itself in low amplitude, high frequency motion and is contacted with a polishing pad that is stationary or in linear, rotational, oscillatory or orbital motion (or a combination of these) relative to the wafer surface.

The invention also provides an apparatus for polishing semiconductor wafers to planarize the surfaces of the wafers. In one embodiment, the apparatus includes a carrier adapted for securely holding at least one semiconductor wafer on an underside of the carrier, with the surface of the wafer to be polished adjacent to a polishing pad, supported on a platen, spaced from the carrier underside. The apparatus includes a mechanism for imparting high frequency, low amplitude motion to the platen or the wafer carrier. In one embodiment, the mechanism includes a stacked pair of rotary bearings with an upper bearing fixedly mounted to the platen and an upper portion of a cylindrical sleeve, that has central axes in its upper and lower portions offset from each other, extending vertically below the platen. A lower bearing is mounted to the lower portion of the cylindrical sleeve and housing of the apparatus, such that the axes of rotation of the bearings are offset by a relatively small distance as compared to an orbital polisher. Thus when a drive motor and gear box rotates the sleeve at high speed, the platen "orbits" to produce low amplitude, high frequency vibratory motion.

The invention also provides an apparatus in which the wafer undergoes low amplitude, high frequency motion; while the polishing pad either rotates, orbits, oscillates, moves linearly, or is held stationary. In one embodiment, the mechanism for imparting vibratory motion to the carrier may substantially correspond to the apparatus for imparting such motion to the platen.

Using the apparatus of the invention, and applying the method of the invention, semiconductor wafers are produced that are more planar, with reduced surface defects across the entire surface area, than wafers that are polished without the vibratory motion of the invention. Moreover, polish times may be reduced, thereby increasing throughput.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings which are schematic and not to scale, wherein.

DETAILED DESCRIPTION OF THE PREFERRED EMBODIMENT

This section illustrates aspects of the invention, and points out certain preferred embodiments of these aspects. This section is not intended to be exhaustive, but rather to inform and teach the person of skill in the art who will come to appreciate more fully other aspects, equivalents, and possibilities presented by invention, and hence the scope of the invention as set for the in the claims, which alone limit its scope.

The invention provides both a method and apparatus for vibrational polishing of workpieces, such as semiconductor wafers. The vibrational polishing of the invention may be combined with other types of polishing motion, such as orbital, rotational, translational, and sweeping motions. A description of how to produce oscillatory motion may be found in our U.S. Pat. No. 6,184,139, entitled "Oscillating Orbital Polisher and Method" filed Sep. 17, 1998, which is hereby incorporated by reference to the extent pertinent.

In accordance with the method of the invention, a workpiece is subject to vibratory polishing motion that provides a more uniform removal of stock from the polished surface, and that reduces any edgeband width, that is often found with certain orbital polishers. The vibratory or vibrational polishing motion is produced by very small polishing movements, either by a polishing pad, or the device holding the workpiece, at a relatively high frequency to produce a vibrational motion. While the vibration may be caused by a small range of orbital-type motion, this is not the exclusive method for producing such vibration. Rather, vibratory or vibrational motion should be understood as motion having a small amplitude, preferably in the range from about 0.05 to about 2.0 mm, more preferably from about 0.5 to about 1.0 mm, and most preferably from about 0.1 to about 0.5 mm.

Figure 1A:
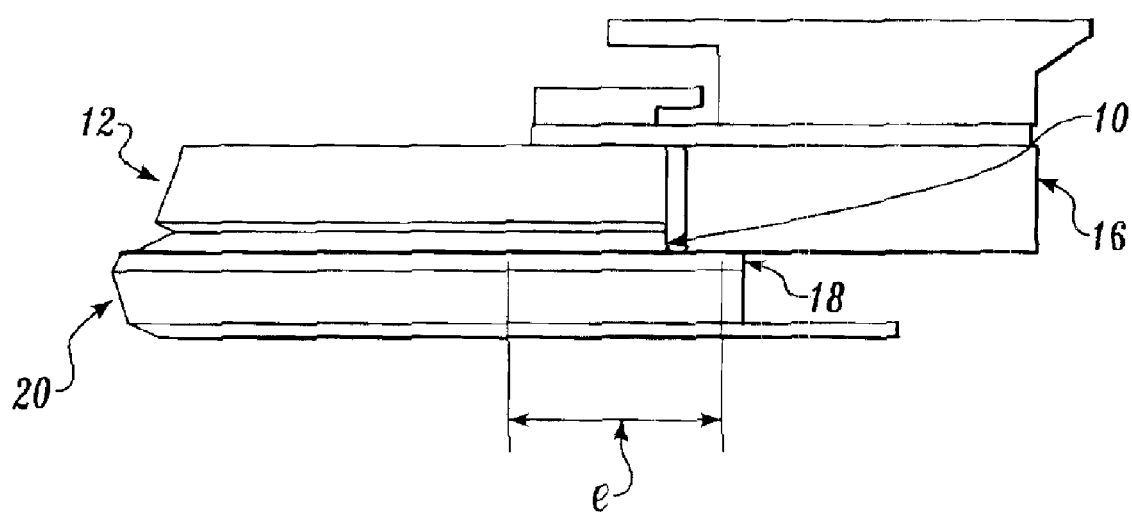
FIG. 1A is a schematic diagram showing a cross-sectional view of a relevant portion of an orbital polishing apparatus and a wafer surface subjected to polishing with the prior art apparatus.
Figure 1B:
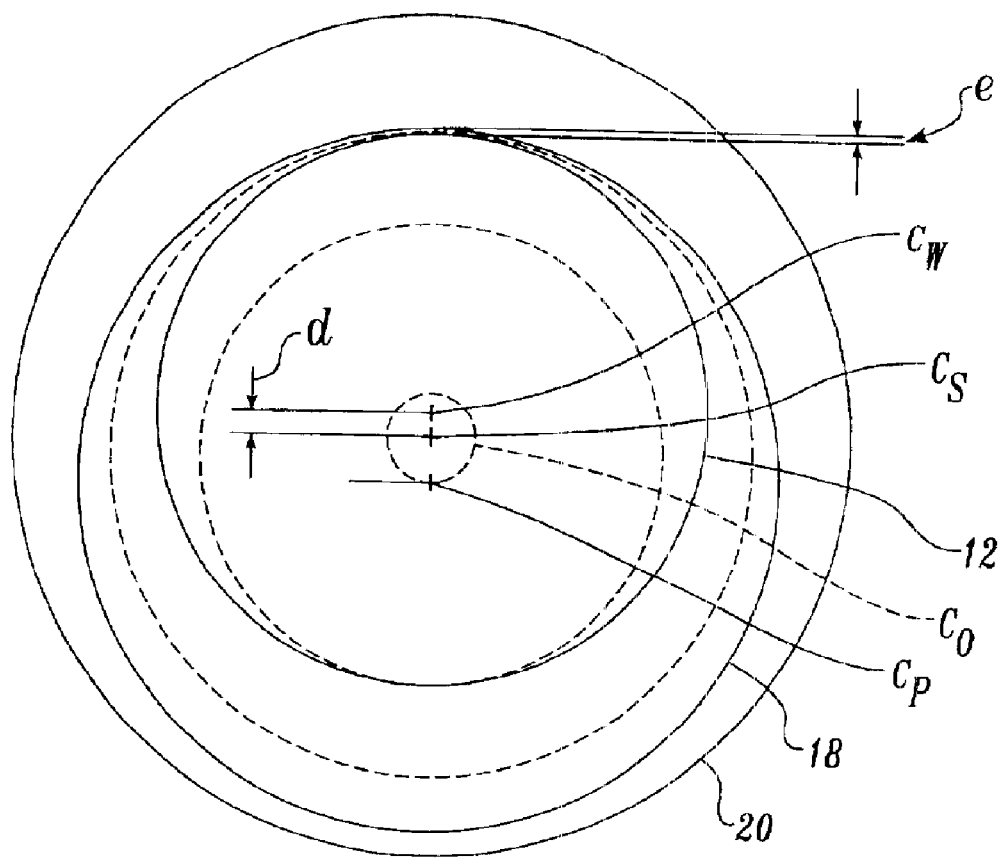
FIG. 1B is a top view schematic showing the location of the wafer, polish pad and wave generator.
Figure 2:
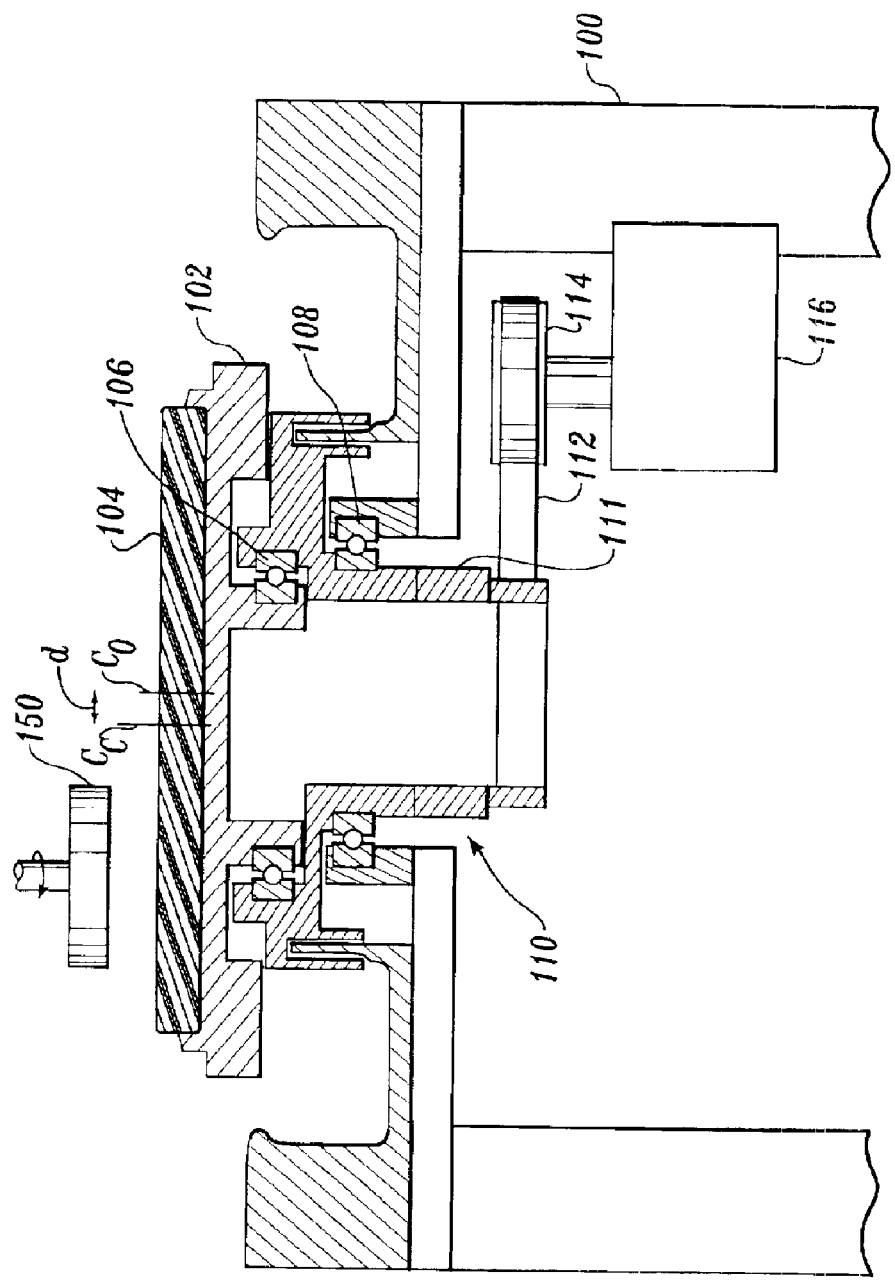
FIG. 2 is a schematic partial side view in cross section of a preferred embodiment of the apparatus of the invention.

Referring to FIG. 2, an embodiment of the apparatus of the current invention, the apparatus includes a frame 100 onto which is mounted a platen 102 that is equipped with a polishing pad 104. The apparatus includes a pair of rotary bearings, the upper rotary bearing 106 is fixedly mounted to an underside of the platen 102, and a rotatable "vibration generator" 110 that includes a substantially cylindrical sleeve 111 extending downward under the platen 102. A first central axis Co of the upper rotary bearing 106 of the wave generator 110 is offset from the second central axis Cc of the lower rotary bearing 108 by distance d. The lower rotary bearing 108 is fixedly mounted to the lower portion of the sleeve 111, and to the supporting frame 100 of the apparatus. Thus, when the vibration generator 110 is brought into rotational motion, the first central axis Co orbits about the second central axis Cc of the lower rotary bearing 108 at a rate equal to the rotation rate of the vibration generator 110 to produce vibrational motion. The amplitude of vibration is equal to 2d, and the frequency of the vibration is the speed of rotation of the platen 102, imparted by the motor 116. As indicated in FIG. 2, rotary motion is imparted to the vibration generator 110 by means of a drive belt 112 that embraces sleeve 111 and that extends over a pulley 114 coupled to drive motor 116.

In the preferred embodiment of the invention, developed for polishing standard 8 and 12-inch wafers, the axis of rotation of the upper and lower bearings are offset by displacement d which is in the range from about 0.05 to about 2.0 mm., preferably about 0.50 to 1.0 mm, and more preferably about 0.10 to about 0.50 mm. This provides "low amplitude motion" in the sense of displacement of polishing surface movement relative to surface being polished. Motions other than orbital type are also useful (for example linear, rotational, elliptical) as long as the motion is of low amplitude.

In accordance with the invention, the low amplitude motion is at high frequency or speed, required to obtain commercially acceptable removal rates. Typical useful frequencies are in the range from about 2,000 to about 10,000 cycles per minute; although higher or lower frequencies may also be useful.

It will be readily apparent that in the above embodiment of the apparatus of the invention, the surface of a workpiece being polished may be subjected to a combination of several kinds of motion, depending upon mode of operation and apparatus. For example, when the platen both vibrates and rotates, and the wafer carrier rotates, the wafer surface is subjected to vibrational and two kinds of rotational polishing movement. On the other hand, when the platen vibrates and rotates, while the wafer carrier translates linearly, the wafer surface is subjected to vibrational, rotational and translational polishing movement. When the wafer carrier is stationary, the wafer surface is subjected to vibrational and rotational polishing movement.

In accordance with term usage of this document, "a rotational polishing movement" refers to movement of the device (carrier or platen) and not the actual movement experienced (or traced) by a locus on the wafer surface; the same applies to "vibrational", "linear", "oscillating", "sweeping" and "orbital" polishing movements.

It will be readily apparent to one of skill in the art who has read this disclosure, that mode of movement of the carrier and platen can be reversed, i.e., the wafer carrier may be equipped with mechanical means to generate vibrational movement; while the platen may be retained stationary or may rotate, orbit, or translate linearly. Accordingly, the invention also provides an apparatus for carrying out this "reverse" application of polishing movement, through the embodiment illustrated in FIGS. 3 and 4. Since many of the component parts of the apparatus are similar to that of the above-described embodiment, the same numerals are used for simplicity. In this instance, the wafer carrier 150 is linked to a vibration generator 110, that is similar to the vibration generator described above in that is comprised of two bearings 106, 108 spaced vertically from each other, and with centers of rotation offset. The lower bearing 108 is mounted to a support structure, such as the housing 154, which is in turn supported by a support structure 156. One end of the vibration generator has a cylindrical sleeve 111 which is driven by a belt 112 that passes over a drive pulley 114 of an electrical motor 116 which preferably has speed control.

Figure 3:
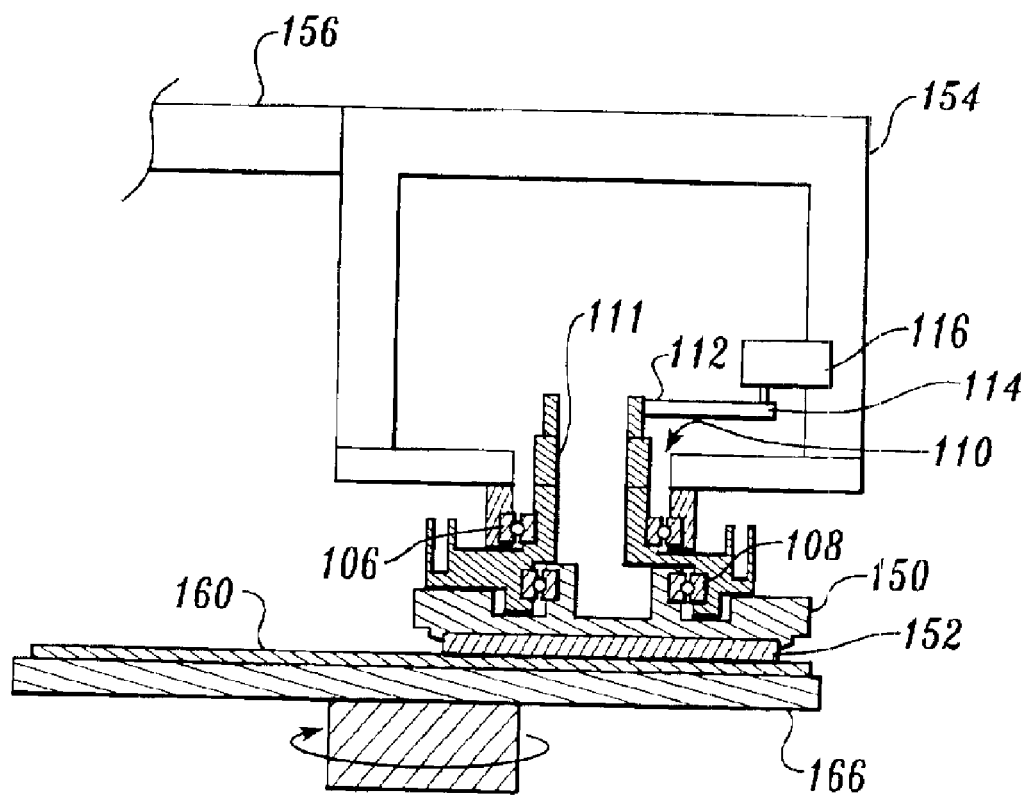
FIG. 3 is a schematic illustration showing side view, in partial cross-section to show details of an alternative embodiment of the invention, wherein a wafer carrier is equipped to both rotate and vibrate, against a polishing pad that is either stationary or rotating.

In FIG. 3, the wafer carrier, when it contains a wafer 152, is brought into contact with the pad 160 which is supported on platen 166, which may rotate or which may be held stationary. When the platen rotates, the pad sweeps across the face of the wafer being polished in a "sweeping motion". At the same time, operation of the above-described apparatus imparts a vibratory motion to the wafer carrier (and hence to the wafer) along with complete rotation of the carrier around its central axis. Thus, the apparatus provides the possibility of several permutations of polishing movement on the surface of the wafer: (1) vibrational, rotational and sweeping polishing movement; (2) vibrational and sweeping polishing movement; and (3) only vibrational polishing movement.

Figure 4:
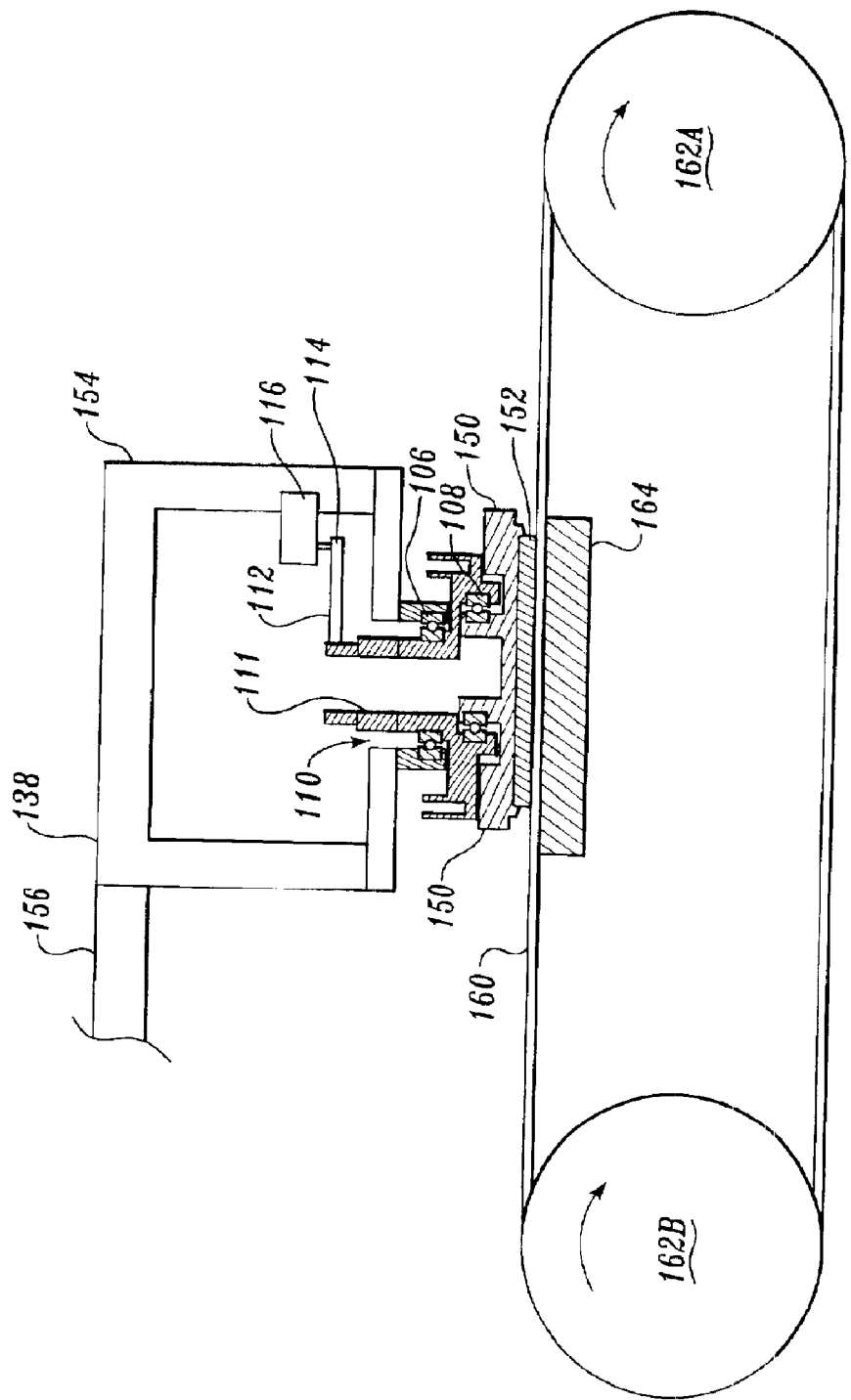
FIG. 4 is a schematic diagram, in partial side cross-section to show detail, illustrating an alternative embodiment of the invention, wherein the wafer carrier is equipped to vibrate and rotate while the wafer is brought into contact with a continuous belt polishing pad that slides linearly across the surface of the semiconductor substrate.

The embodiment of FIG. 4 provides yet another variation of the above-described invention. In this instance, the polishing pad is in the form of a continuous belt 160 that passes over to rollers 162a and b, one of which is a drive roller. Thus, the polishing pad moves linearly relative to the wafer carrier 150 at a controlled rate. Preferably, the polishing pad moves at a rate of about 100 to about 200 centimeters per second. The polishing pad is preferably backed with a rigid backing slide plate 164 that is mounted to a support the pad and allow controlled pressing of the wafer surface against the pad, without untoward yielding of the moving continuous belt pad 160. In accordance with this embodiment of the invention, a wafer surface being polished may also be subject to several types of polishing movement.

Figure 5:
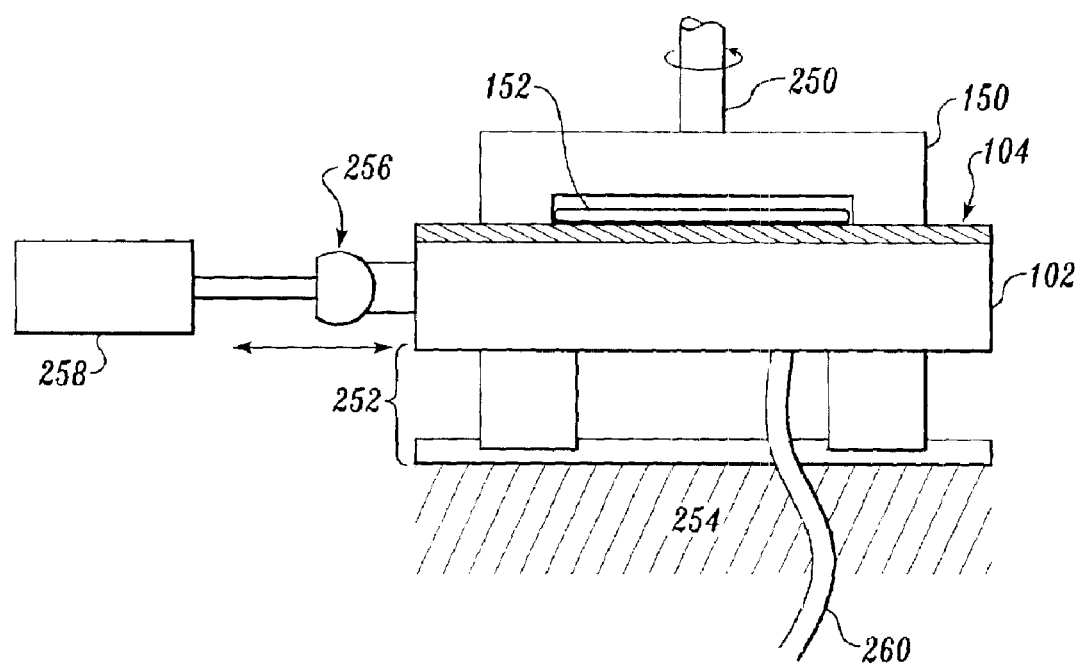
FIG. 5 is a schematic illustration of an embodiment of the invention utilizing a linearly moving pad mounted to a linear guide system, coupled to a vibration actuator, to polish a wafer held in a carrier that optionally rotates.

A further embodiment, shown in FIG. 5, is of a linear polisher, or combination of linear and rotational polisher, equipped with vibratory motion in accordance with the invention. As shown, wafer 152 is held in a wafer carrier 150, that may be rotated through spindle 250 coupled to the carrier. Beneath the carrier, and facing the surface of the wafer to be polished, is a polishing pad 104 mounted to a rigid platen 102, that is able to move backward and forward linearly relative to the wafer surface, or the underside of the carrier, through a linear guide system 252. These linear guide systems are known in the art, and may include for example mounting the platen to wheels on rails, and coupling an end of the platen to a motor that alternately pushes and pulls the platen back and forth on the rails. Other mechanisms may also be used, and are commercially available. In accordance with the invention, the linear motion of the platen 102 is modified by adding vibratory motion through a vibration actuator 258 coupled through a mechanical coupling 256 to a side of the platen, preferably at right angles to the back and forth movement of the platen while engaged in linear polishing. Preferably, the mounting of the platen is such that the platen can move (vibrate) with respect to the linear guide system. Thus, the platen may be mounted to rails allowing it limited movement at right angles to the movement of the platen with the linear guide system, for example. Otherwise, resilient mounts may be used to facilitate vibratory motion of the platen in a direction about at right angles to the back and forth linear polishing motion. Otherwise, the vibration actuator may cause the entire structure to vibrate, when there is sufficient lateral "play" or tolerance in the guides. Thus, the apparatus illustrated is able to provide at least three kinds of polishing motion: linear through the rigid platen's movement; vibratory polishing through the vibration actuator coupled to the platen; and optionally rotational polishing through rotation of the carrier 150 coupled to a motor by a spindle 250 as illustrated, the polishing may be carried out dry, or with the aid of a chemical slurry delivered through tube 260 to the interface between the wafer 152 and the polishing pad 104

Figure 6:
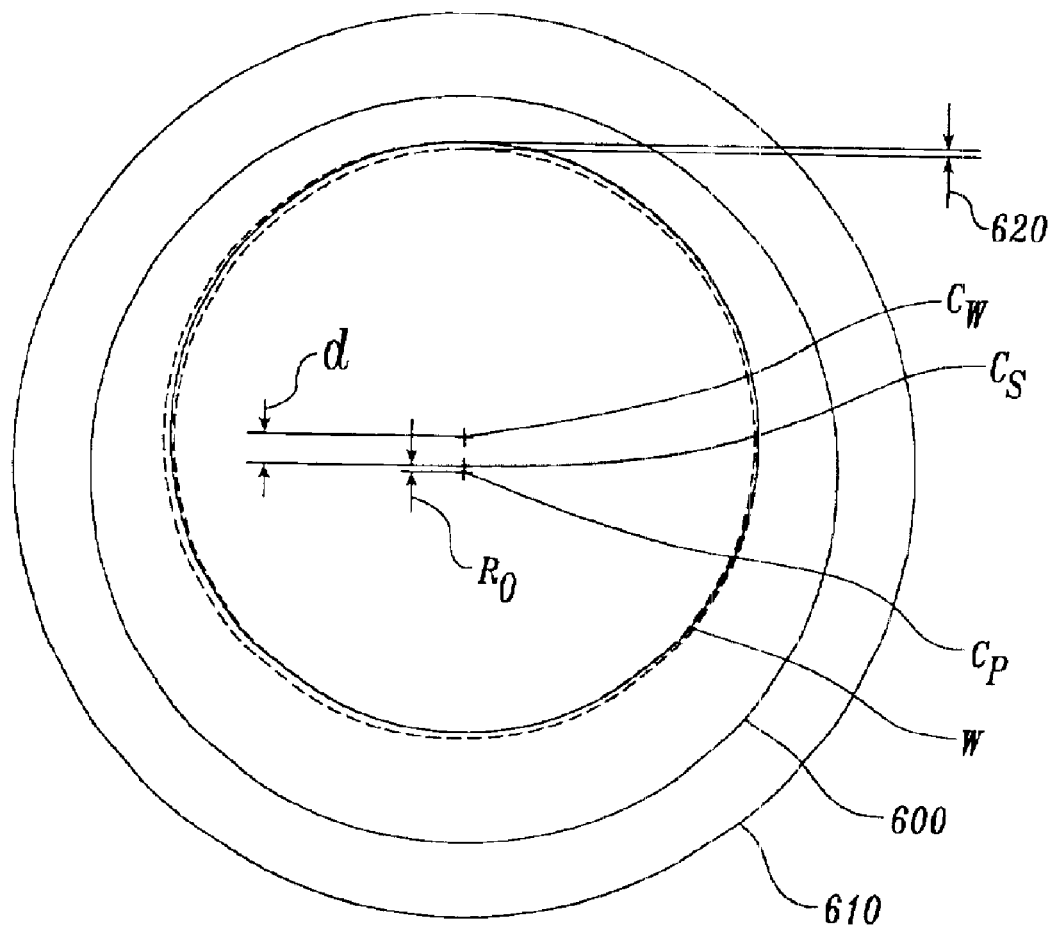
FIG. 6 is a schematic diagram demonstrating a reduction in the size of the differential removal rate band at the periphery of a semiconductor wafer, as a result of polishing in accordance with an embodiment of the invention.

As schematically illustrated in FIG. 6, the differential removal rate band is dramatically reduced in width when polishing is carried out in accordance with the method of the invention. In the illustrated exemplary embodiment, the wafer W rotated about its own center Cw and was polished by a 10 in. (254 mm) diameter pad 600 mounted to a 12 in. (304.8 mm) vibration generator 610 so that the pad center Cp has a 0.05 in. (1.27 mm) orbit radius$R_0$ around the center of spin of the generator Cs. The center of spin Cs of the vibration generator is offset from the center of the wafer Cw by 0.375 in. (9.5 mm). Under these conditions, the differential removal rate band 620 is reduced to 0.050 in. (1.27 mm) in width. As a consequence, a larger proportion of the area of the wafer is more uniformly polished providing the potential for the production of a higher proportion of semiconductor devices that meet specifications from the wafer, even at the edges of the wafer (which have a larger surface area and are therefore able to produce more semiconductors).

While the preferred embodiments of the invention has been illustrated and described, it will be appreciated that various changes can be made therein without departing from the spirit and scope of the invention.

The foregoing description provides an enabling disclosure of the invention, which is not limited by the description but only by the scope of the appended claims. All those other aspects of the invention that will become apparent to a person of skill in the art, who has read the foregoing, are within the scope of the invention and of the claims herebelow.

What is claimed is:

1. An apparatus for polishing a surface of a workpiece, the apparatus comprising:
    (a) a carrier adapted for securely holding at least one workpiece to expose a surface of the workpiece to be polished;
    (b) a polishing pad supported on a platen spaced from the carrier;
    (c) means for imparting vibratory motion to the platen, the means comprising: a sleeve having mounted thereto a pair of rotary bearings, a first bearing of the pair mounted to the platen and the sleeve, the first bearing having a central axis offset by from about 0.05 to about 2.0 mm from a central axis of a second bearing of the pair, the second bearing mounted to the sleeve and a support frame; and
    (d) a drive motor coupled to the sleeve.

2. An improvement in an apparatus for orbital polishing of semiconductor wafers to planarize surface of the wafers, the apparatus comprising a pad mounted in a platen, the platen attached to mechanical means for causing the pad to orbit about an axis offset from a central axis of the pad, the pad spaced from carrier to wafer, the carrier coupled to a drive motor to rotate the carrier, and means for pressing a wafer in the carrier forceably against the pad, the improvement comprising: offsetting the orbital axis from the central axis of the pad by from about 0.05 to about 2.0 mm to cause vibratory motion when the pad orbits.

3. The apparatus of claim 1, wherein the vibratory motion has a frequency of about 2,000 to about 10,000 rpm.

4. An apparatus for polishing workpieces, the apparatus comprising:
    a carrier adapted for holding at least one workpiece;
    a polishing pad supported on a platen spaced from the carrier, the pad for polishing a workpiece in the carrier; the platen coupled to at least a pair of rotary bearings with offset central axes such that when the bearings rotate, the platen vibrates at a frequency in the range from about 2,000 to about 10,000 rpm.

5. The apparatus of claim 4, wherein the axes are offset by from about 0.05 to about 2 mm.

6. An apparatus for polishing a workpiece, the apparatus comprising:
    a carrier for holding at least one workpiece to be polished;
    a platen spaced from the carrier;
    a polishing medium interposed between the platen and the carrier, the medium supported by the platen; and
    means for imparting a rotational motion to the platen and a vibratory polishing motion between the carrier and the platen with the vibrational polishing motion having a frequency of about 2,000 to 10,000 rpm and an amplitude of about 0.05 to about 2.0 mm.

7. The apparatus of claim 6, wherein the platen is a support plate, and the polishing medium is a polishing belt.

8. The apparatus of claim 6, wherein the carrier is coupled to a drive motor for rotating the carrier.

9. The apparatus of claim 6, wherein the carrier is coupled to a drive motor and to means for vibrating the carrier.

10. The apparatus of claim 6, wherein the platen is coupled to a drive motor.

11. The apparatus of claim 6, wherein the platen is coupled to a drive motor and to means for rotating the platen.

12. The apparatus of claim 6, wherein during polishing, carrier movement comprises orbiting and vibrating.

13. The apparatus of claim 6, wherein during the polishing, platen movement comprises orbiting and vibrating.

* * * * *